(12) United States Patent
Abe et al.

(10) Patent No.: US 8,513,715 B2
(45) Date of Patent: Aug. 20, 2013

(54) SEMICONDUCTOR DEVICE

(75) Inventors: Kazuhide Abe, Kanagawa (JP); Tadahiro Sasaki, Tokyo (JP); Atsuko Iida, Kanagawa (JP); Kazuhiko Itaya, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 372 days.

(21) Appl. No.: 12/873,788

(22) Filed: Sep. 1, 2010

(65) Prior Publication Data
US 2011/0220974 A1    Sep. 15, 2011

(30) Foreign Application Priority Data

Mar. 10, 2010   (JP) ................. 2010-052592

(51) Int. Cl.
*H01L 29/78* (2006.01)
(52) U.S. Cl.
USPC ........... 257/288; 257/202; 257/390; 257/416; 257/E25.02; 257/E27.06; 257/E29.255; 257/E29.324
(58) Field of Classification Search
None
See application file for complete search history.

(56) References Cited

U.S. PATENT DOCUMENTS

| | | | |
|---|---|---|---|
| 6,809,604 B2 | 10/2004 | Kawakubo et al. | |
| 6,973,280 B2 | 12/2005 | Nukada et al. | |
| 7,221,920 B2 | 5/2007 | Abe et al. | |
| 8,039,873 B2* | 10/2011 | Abe et al. | 257/202 |
| 8,305,147 B2* | 11/2012 | Sasaki et al. | 330/307 |
| 2002/0190799 A1* | 12/2002 | Morimoto et al. | 331/57 |
| 2005/0124120 A1* | 6/2005 | Du et al. | 438/283 |
| 2006/0202782 A1 | 9/2006 | Martin et al. | |
| 2007/0085153 A1* | 4/2007 | Kalpat et al. | 257/401 |
| 2009/0134430 A1* | 5/2009 | Abe et al. | 257/208 |
| 2009/0243725 A1* | 10/2009 | Abe et al. | 330/277 |
| 2012/0235246 A1* | 9/2012 | Abe et al. | 257/390 |
| 2012/0241877 A1* | 9/2012 | Abe et al. | 257/416 |

FOREIGN PATENT DOCUMENTS

JP    2005-269083    9/2005

OTHER PUBLICATIONS

U.S. Appl. No. 13/220,116, filed Aug. 29, 2011, Abe, et al.

* cited by examiner

*Primary Examiner* — Minh-Loan T Tran
*Assistant Examiner* — Fazli Erdem
(74) *Attorney, Agent, or Firm* — Oblon, Spivak, McClelland, Maier & Neustadt, L.L.P.

(57) ABSTRACT

According to an embodiment, the present invention provides a semiconductor device that is easily integrated with other electronic circuits and functions as an oscillator with high frequency accuracy. The semiconductor device includes: a semiconductor substrate; an element region; an element isolation region that surrounds the element region; a field effect transistor including a gate electrode that is formed on the element region, source and drain regions, and a channel region that is interposed between the source region and the drain region; gate, source, and drain terminals that are used to apply a voltage to the gate electrode, the source region, and the drain region, respectively; and an output terminal that is electrically connected to the channel region. When the threshold voltage of the field effect transistor is $V_{th}$, a gate voltage $V_{gs}$ applied between the source terminal and the gate terminal and a drain voltage $V_{ds}$ applied between the source terminal and the drain terminal satisfy the following relationship: $V_{th} < V_{gs} < V_{ds} + V_{th}$. Also, sn oscillating signal is output from the output terminal.

6 Claims, 13 Drawing Sheets

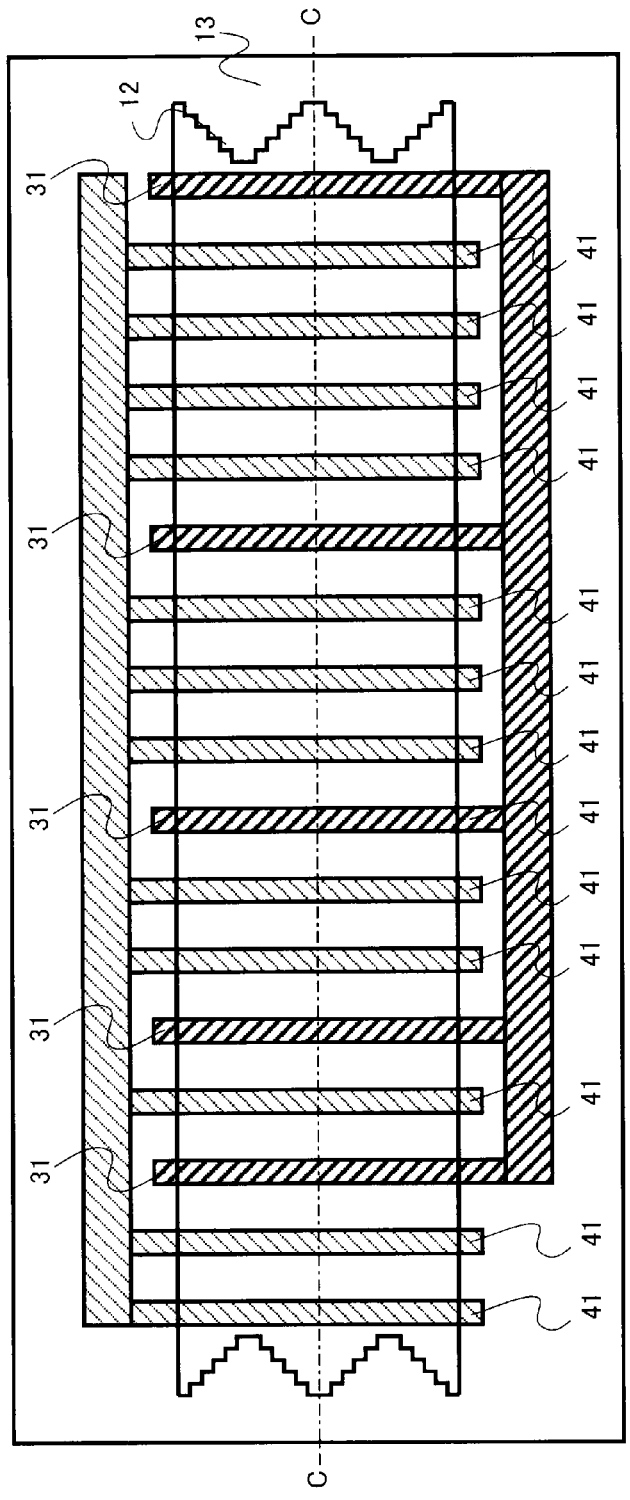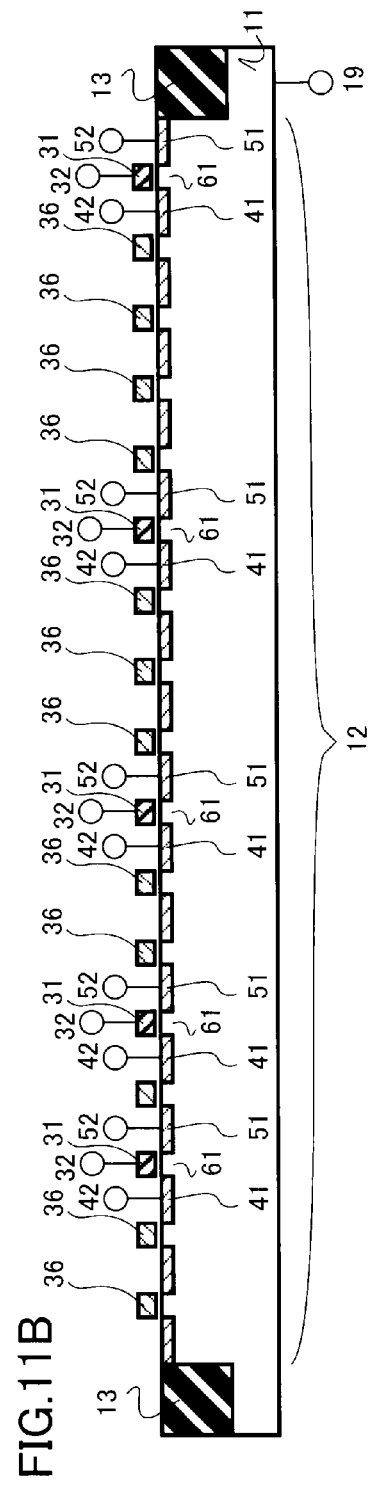
FIG.11A
FIG.11B

SEMICONDUCTOR DEVICE

CROSS-REFERENCE TO RELATED APPLICATION

This application is based upon and claims the benefit of priority from Japanese Patent Application No. 2010-052592, filed on Mar. 10, 2010, the entire contents of which are incorporated herein by reference.

FIELD

Embodiments described herein relate generally to a semiconductor device that functions as an oscillator.

BACKGROUND

Oscillators are used to supply a reference frequency in electronic circuits of, for example, various kinds of home appliances, communication apparatuses, and information processing systems. The oscillators can be classified into oscillators using a signal delay caused by a circuit, such as ring oscillators or CR oscillators, and oscillators using a resonator. It has generally been known that the latter has higher frequency accuracy than the former.

The resonators can be classified into resonators using electromagnetic resonance, such as LC resonators, and resonators using mechanical resonance, such as piezoelectric resonators or MEMS resonators. It has generally been known that the latter has higher frequency accuracy than the former.

In the related art, piezo-resonators, such as quartz resonators or surface acoustic wave resonators, have been used in order to obtain high frequency accuracy. In this case, it is difficult to incorporate the piezo-resonator with other electronic circuits including, for example, an amplifying circuit. A ring oscillator or an LC oscillator has been used in order to improve the density of integration between the oscillator and other electronic circuits. However, in this case, it is difficult to obtain high frequency accuracy.

An integrated oscillating circuit has been proposed which is provided with a variable capacitance element in order to obtain high-accuracy oscillating frequency.

BRIEF DESCRIPTION OF THE DRAWINGS

FIGS. 11A and 11B are diagrams schematically illustrating the structure of a semiconductor device according to the third embodiment.

DETAILED DESCRIPTION

Figure 1A:
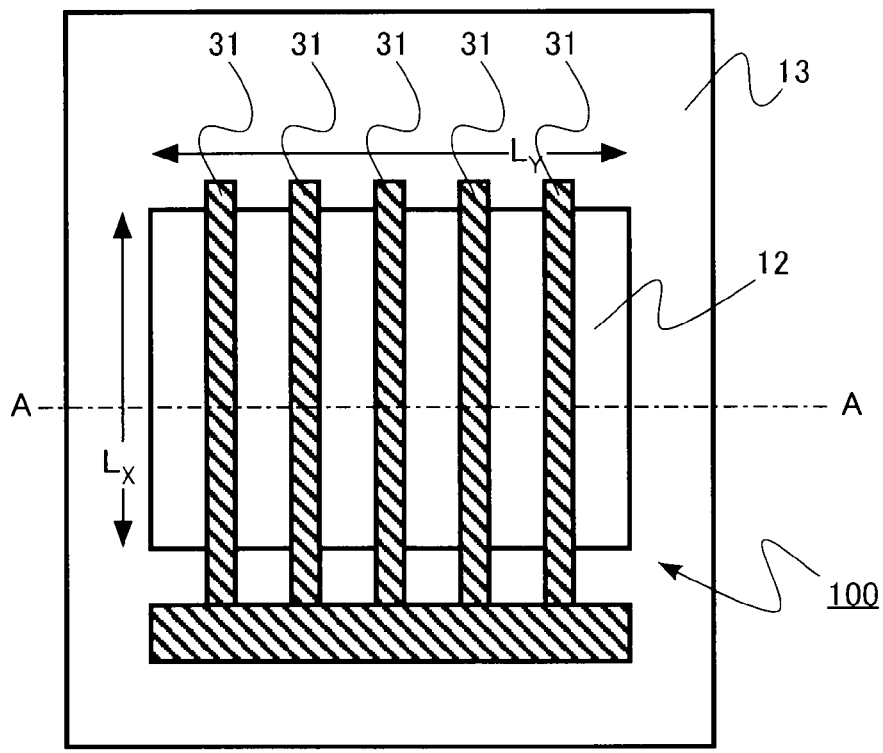
FIGS. 1A and 1B are diagrams schematically illustrating the structure of a semiconductor device according to the first embodiment.

According to an embodiment, the present invention provides a semiconductor device that is easily integrated with other electronic circuits and functions as an oscillator with high frequency accuracy. The semiconductor device includes: a semiconductor substrate; an element region; an element isolation region that surrounds the element region; a field effect transistor including a gate electrode that is formed on the element region, source and drain regions, and a channel region that is interposed between the source region and the drain region; gate, source, and drain terminals that are used to apply a voltage to the gate electrode, the source region, and the drain region, respectively; and an output terminal that is electrically connected to the channel region. When the threshold voltage of the field effect transistor is $V_{th}$, a gate voltage $V_{gs}$ applied between the source terminal and the gate terminal and a drain voltage $V_{ds}$ applied between the source terminal and the drain terminal satisfy the following relationship: $V_{th}<V_{gs}<V_{ds}+V_{th}$. Also, sn oscillating signal is output from the output terminal. Hereinafter, exemplary embodiments of the present invention will be described with reference to the accompanying drawings.

The inventors found that, when a field effect transistor was operated under specific voltage conditions, a substrate current was oscillated. The invention was achieved on the basis of the findings.

In the specification, a "terminal", such as a gate terminal of a gate electrode, is not necessarily a structure that is independently discriminated from, physically, an electrode, an impurity diffusion region, a contact region, or a wiring region. For example, any structure may be used as the gate terminal as long as it can apply potential to the gate electrode.

First Embodiment

A semiconductor device according to the first embodiment includes: an element region that is formed in a semiconductor substrate; an element isolation region that surrounds the element region; a field effect transistor including a gate electrode that is formed on the element region, source and drain regions that are formed on both sides of the gate electrode in the element region, and a channel region that is formed in the element region so as to be interposed between the source region and the drain region; gate, source, and drain terminals that are used to apply a voltage to the gate electrode, the source region, and the drain region, respectively; and an output terminal that is electrically connected to the channel region. The threshold voltage of the field effect transistor $V_{th}$, a gate voltage $V_{gs}$ applied between the source terminal and the gate terminal and a drain voltage Vds applied between the source terminal and the drain terminal satisfy the following relationship: $V_{th}<V_{gs}<V_{ds}+V_{th}$. Also, an oscillating signal is output from the output terminal.

The semiconductor device according to this embodiment functions as an oscillator and outputs an oscillating signal to the output terminal.

Figure 1B:
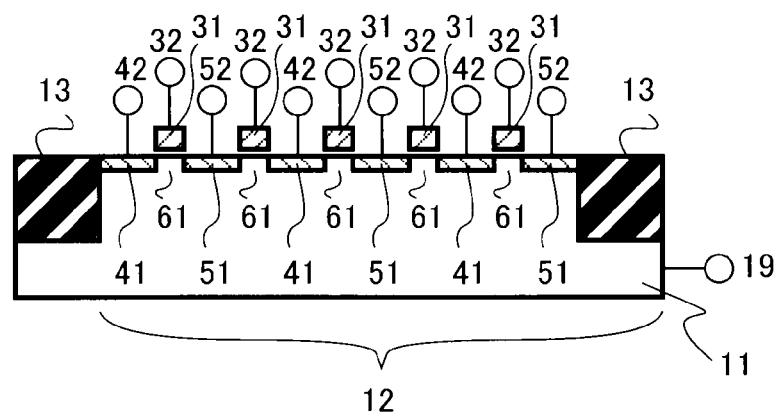

FIGS. 1A and 1B are diagrams schematically illustrating the structure of the semiconductor device according to this embodiment. FIG. 1A is a plan view and FIG. 1B is a cross-sectional view taken along the line A-A of FIG. 1A.

As shown in FIG. 1, for example, an element region 12 is formed in a semiconductor substrate 11 made of silicon. The element region may also be called active region or active area. The element region 12 is surrounded by an element isolation region 13 which is formed of an insulating film, for example, a silicon oxide film. The element region 12 has, for example, a rectangular shape having a size with a length of $L_X$ and a side with a length of $L_Y$.

A field effect transistor 100 is formed on the element region 12. The field effect transistor 100 includes a gate electrode 31, a source region 41, a drain region 51, and a channel region 61.

The gate electrode 31 is formed on the element region 12 with a gate insulating film (not shown) interposed therebetween. In this embodiment, five gate electrodes 31 are formed which are physically parallel to each other and are connected electrically in parallel.

The source region 41 and the drain region 51 are formed on both sides of the gate electrode 31 in the element region 12. For example, an impurity diffusion layer having a conductive type opposite to that of the semiconductor substrate is provided. A channel region 61 is formed in the element region 12 so as to be interposed between the source region 41 and the drain region 51.

A gate terminal 32, a source terminal 42, and a drain terminal 52 that respectively apply a voltage to the gate electrode 31, the source region 41, and the drain region 51 are provided. A gate terminal 32, a source terminal 42, and a drain terminal 52 are input terminals. In addition, an output terminal 19 is provided on the semiconductor substrate 11 in this embodiment. The output terminal is electrically connected to the channel region 61 through the semiconductor substrate 11.

When the threshold voltage of the field effect transistor 100 is $V_{th}$, the gate voltage $V_{gs}$ applied between the source terminal 42 and the gate terminal 32 from, for example, a DC voltage source and the drain voltage $V_{ds}$ applied between the source terminal 42 and the drain terminal 52 from, for example, a DC voltage source satisfy the following Expression 1:

$$Vth < Vgs == Vds + Vth \qquad \text{[Expression 1]}$$

An oscillating signal is output from the output terminal 19 as substrate current in this embodiment. In the specification, the term "substrate current" means the current that is generated in a substrate or a well due to impact ionization in the channel region of the field effect transistor.

Figure 2:
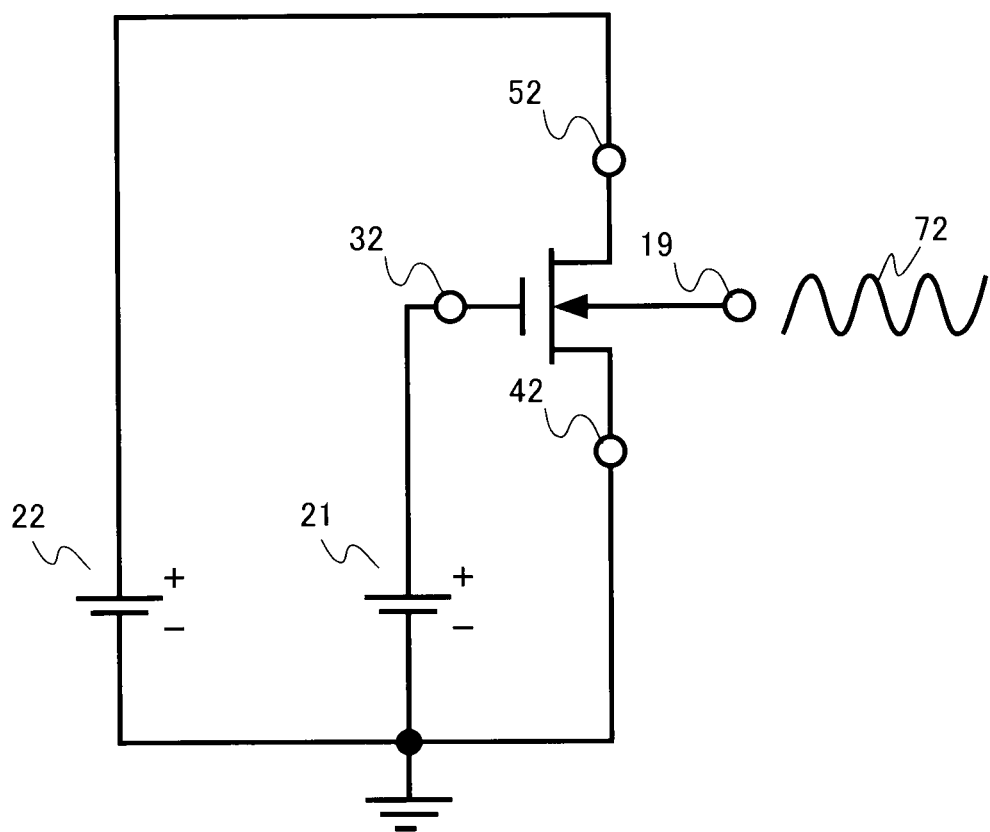
FIG. 2 is an equivalent circuit diagram of the semiconductor device according to the first embodiment.

FIG. 2 is an equivalent circuit diagram of the semiconductor device according to this embodiment. DC voltage sources 21 and 22 are connected to each other and a constant voltage is applied to the gate terminal 32, the source terminal 42, and the drain terminal 52 so as to satisfy Expression 1.

Figure 3:
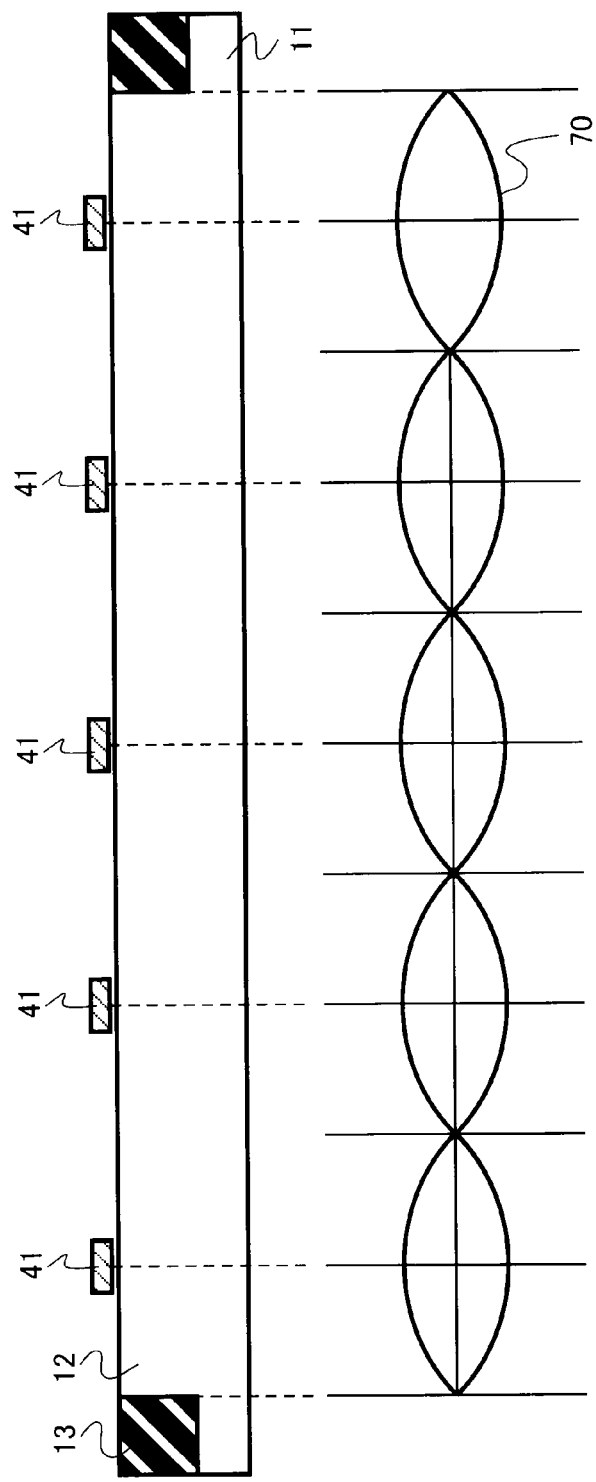
FIGS. 3A and 3B are diagrams illustrating the operation of the semiconductor device according to the first embodiment.

FIGS. 3A and 3B are diagrams illustrating the operation of the semiconductor device according to this embodiment. FIG. 3A is a cross-sectional view illustrating the semiconductor device and FIG. 3B is a diagram illustrating an acoustic standing wave. In the semiconductor device according to this embodiment, the DC voltage is applied to excite an acoustic standing wave 70 in the element region 12 surrounded by the element isolation region 13, which is an acoustic reflection layer, as shown in FIGS. 3A and 3B.

The probability of impact ionization in the channel region 61 of the field effect transistor 100 formed in the element region 12 is changed over time in synchronization with the period of the acoustic standing wave 70 excited in the element region 12. Since an electron-hole pair generated by impact ionization has high energy, a portion thereof reaches the semiconductor substrate 11 as a substrate current. Since the substrate current is periodically changed in synchronization with the acoustic standing wave 70, it is possible to detect a periodic electric signal 72 from the output terminal 19 of the semiconductor device.

Figure 4:
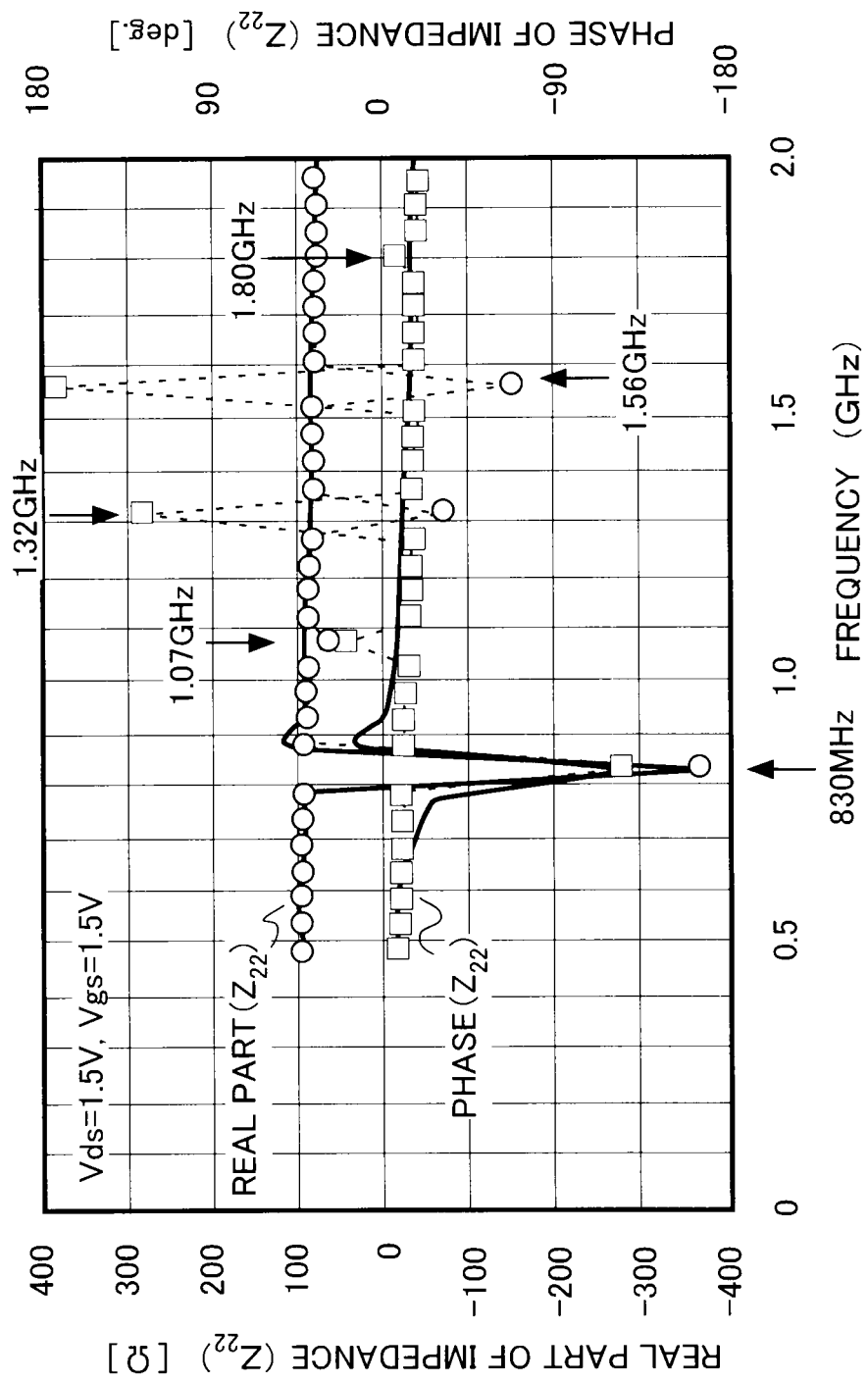
FIG. 4 is a diagram illustrating an example of the measurement result of impedance of the semiconductor device according to the first embodiment.

FIG. 4 is a diagram illustrating an example of the measurement result of the impedance of the semiconductor device according to this embodiment. In the semiconductor device having the structure shown in FIGS. 1A and 1B, a network analyzer is used to measure the frequency dependency of impedance ($Z_{22}$) as viewed from the drain terminal side. In FIG. 4, the horizontal axis indicates a frequency and the vertical axis indicates the real part of the impedance and the phase of the impedance.

The measured values are represented by circular and rectangular symbols and a dotted line linking the symbols. In addition, a value obtained by a simulation using an equivalent circuit is represented by a solid line. In the example of the measurement, the oscillation peak of impedance is observed at a periodic interval, for example, at 830 MHz, 1.07 GHz, 1.32 GHz, 1.56 GHz, and 1.80 GHz. As such, the actual measurement and simulation proved that the substrate current was periodically changed and oscillated.

Figure 5:
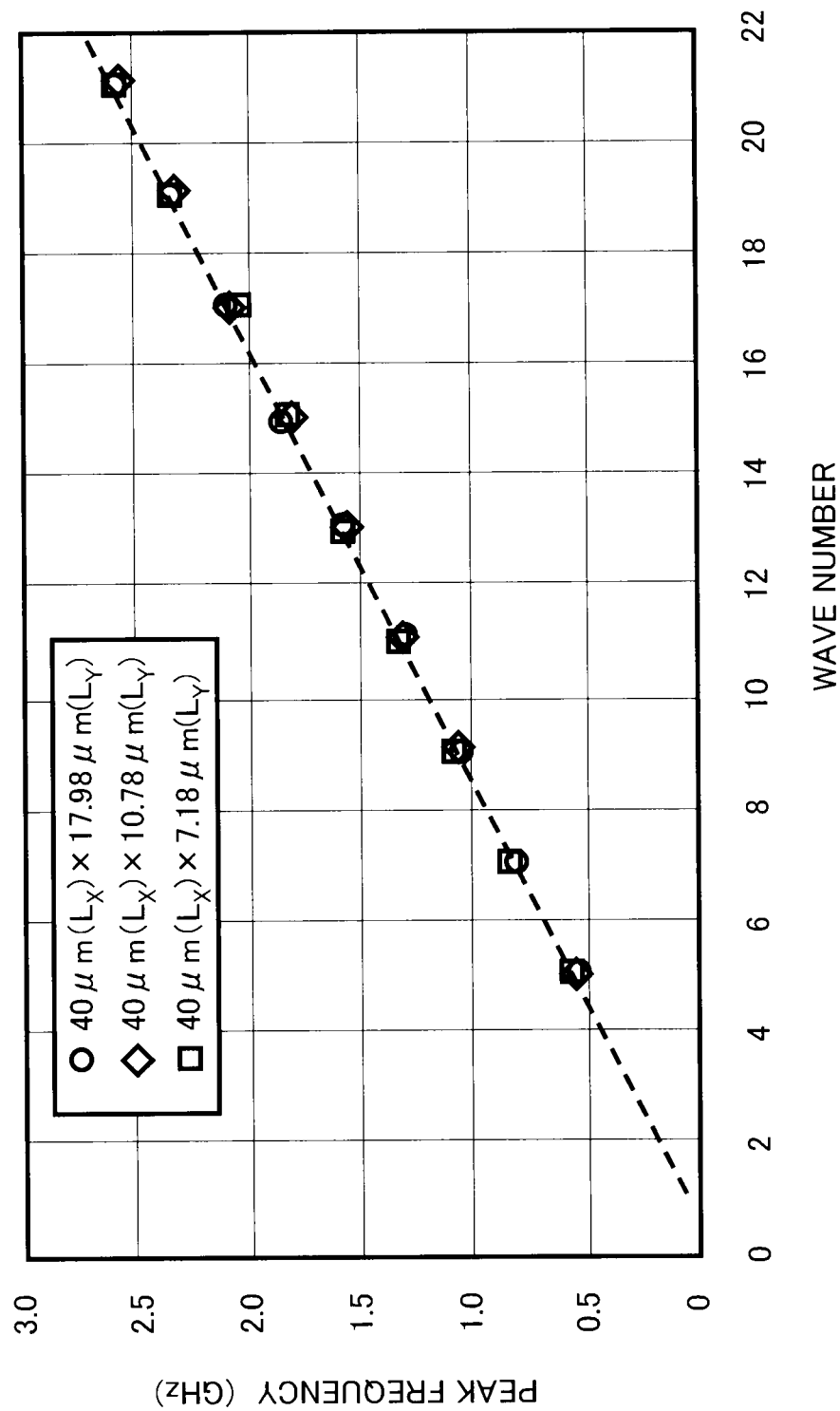
FIG. 5 is a diagram illustrating the dependency of an oscillation peak on the size of the element region.

FIG. 5 is a diagram illustrating the dependency of the oscillation peak with respect to the size of the element region. FIG. 5 is obtained by allocating appropriate wave numbers (integers) to the oscillation peak frequencies of some semiconductor devices with different lengths of $L_X$ and $L_Y$ shown in FIG. 1 and plotting them. The element regions have rectangular shapes with sizes of 40 µm×7.18 µm, 40 µm×10.78 µm, and 40 µm×17.89 µm. However, as can be seen from FIG. 5, the oscillation peak is observed substantially at the same frequency, regardless of the sizes of the element regions. This shows that an acoustic standing wave with the oscillation peak determined by the length (in FIG. 1, $L_X$=40 µm) of the side of the element region is excited in these semiconductor devices.

Figure 6:
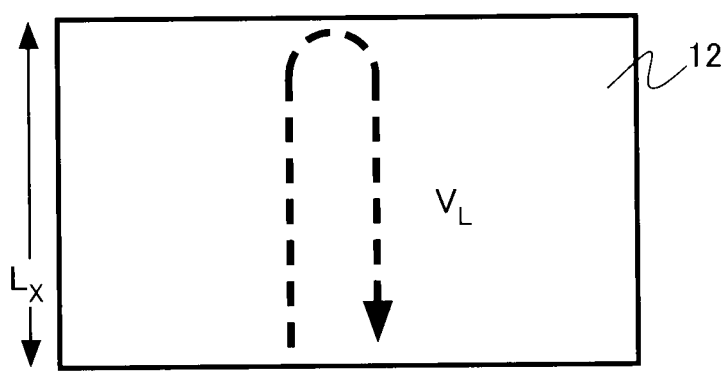
FIG. 6 is a diagram illustrating the excitation conditions of an acoustic standing wave.

FIG. 6 is a diagram illustrating the excitation conditions of the acoustic standing wave. When the speed of sound propagated through the semiconductor substrate is $V_L$, the speed of sound is a property value unique to a material. It has been known that, in the case of a longitudinal wave propagated through a silicon semiconductor monocrystalline substrate, $V_L$ is $8.43 \times 10^5$ cm/S.

Actually, the acoustic wave excited in the element region 12 is not limited to the longitudinal wave, but it is considered that another mode, for example, an excitation mode is likely to be an interface wave that propagates the interface between a silicon single crystal and a silicon oxide. In this case, it is possible to calculate the sound speed $V_L$ from the side $L_N$ (=40 µm) of the element region of the semiconductor device, which is measured in FIG. 5, using the following Expression 2:

$$\frac{2L_X}{N \cdot V_L} = \frac{1}{f_N} \qquad \text{[Expression 2]}$$

$$\frac{f_N}{N} = \frac{V_L}{2L_X}$$

In the above-mentioned expression, N indicates an oscillation order and $f_N$ indicates an Nth-order oscillating frequency. The value of the oscillating frequency $f_N/N$ per wave number calculated from the measurement result is about 120

MHz and the sound speed $V_L$ obtained from the oscillating frequency is about $9.6\times10^5$ cm/S. It has been known that the sound speed depends on, for example, the propagation mode. Therefore, the sound speed of the acoustic standing wave is regarded to be substantially equal to that of the longitudinal wave. The measurement result also proves that the observed oscillation peak is caused by the acoustic standing wave excited in the element region 12.

Figure 7:
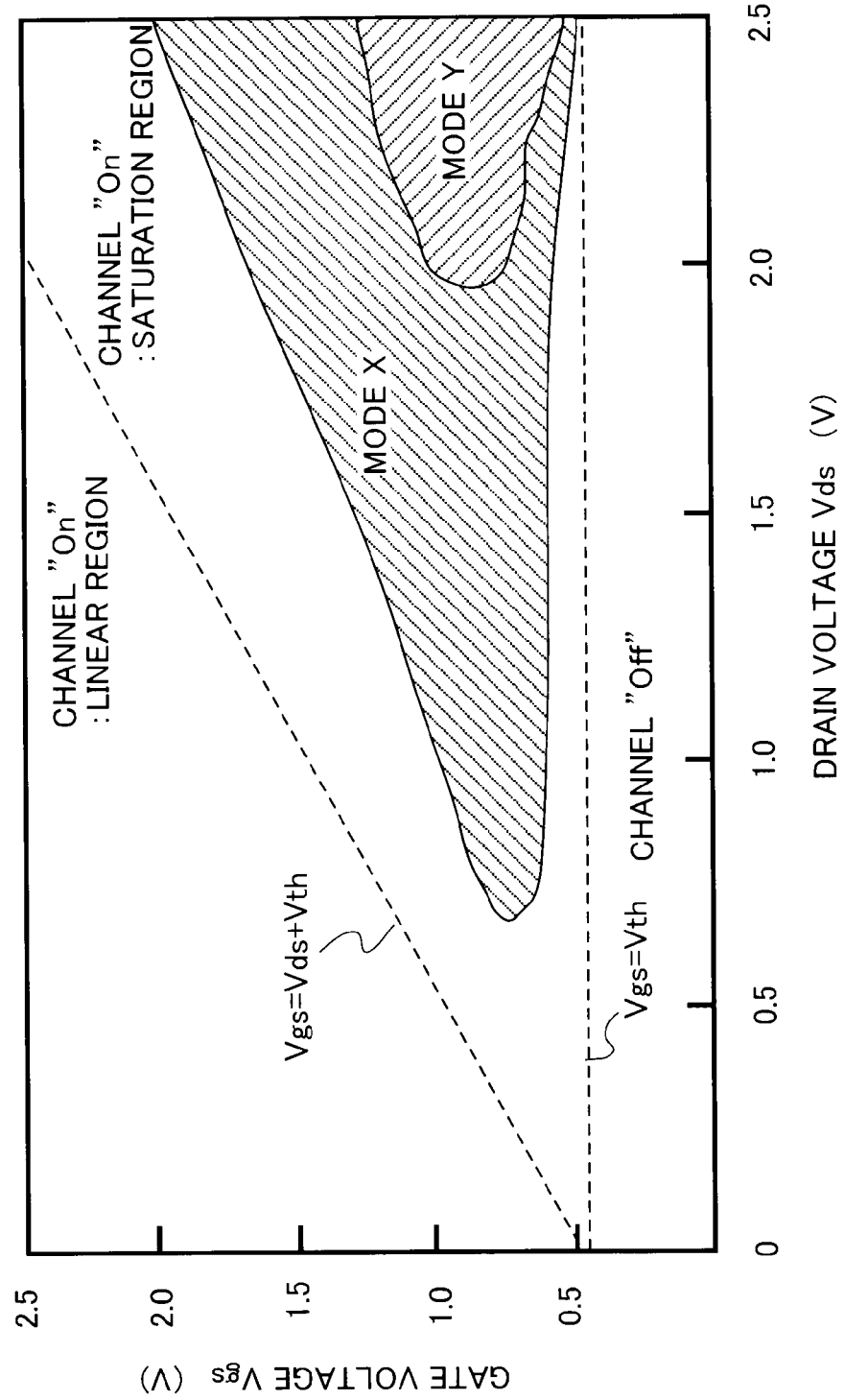
FIG. 7 is a diagram illustrating the relationship between a voltage applied and the mode of the acoustic standing wave.
Figure 8:
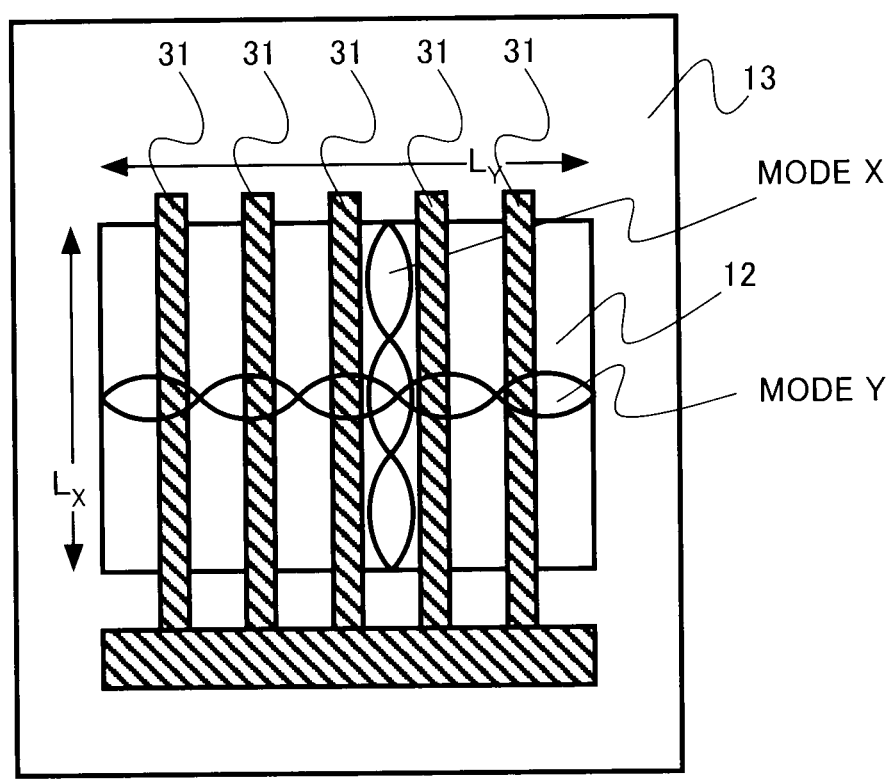
FIG. 8 is a diagram illustrating each mode.

FIG. 7 is a diagram illustrating the relationship between the voltage applied and the mode of the acoustic standing wave. FIG. 8 is a diagram illustrating each mode.

When the gate voltage Vgs is less than the threshold voltage Vth, the field effect transistor is turned off and no drain current flows through the channel between the drain and the source. Therefore, impact ionization does not occur.

In a linear region in which the gate voltage Vgs is sufficiently high, the entire channel is turned on and the drain current flows. However, since a strong electric field is not applied to electrons flowing through the channel, impact ionization does not occur and the acoustic standing wave is not excited.

Under bias voltage conditions where the drain current of the transistor is saturated, a portion of the channel is pinched off and electrons are strongly accelerated. As a result, the impact ionization phenomenon occurs and an electron-hole pair is generated. In this case, since electrons with excessively high energy collide with the crystal of the semiconductor, a portion of the energy is converted into crystal lattice vibration. A portion of the energy of the lattice vibration is used to amplify the acoustic phonon and thereby to excite the acoustic standing wave in the semiconductor region.

Therefore, in order to excite the acoustic standing wave, the semiconductor device according to this embodiment is driven under the voltage conditions of Expression 1.

The voltage condition range in which the actual oscillation peak is observed, which is a hatched region in FIG. 7, is narrower than the condition range of Expression 1. The reason is as follows. A silicon single crystal used in an integrated circuit has high purity and a small crystal detect. Therefore, when the acoustic wave is propagated through the silicon single crystal, the attenuation of the acoustic wave is relatively small, but a portion of the energy of the acoustic wave is likely to be dissipated and attenuated. In the actual observation, the ranges of the drain voltage $V_{ds}$ and the gate voltage $V_{gs}$ for exciating the standing wave in the element region are likely to be narrower than the ranges of the drain voltage and the gate voltage where the transistor is saturated by the influence of the attenuation.

In FIG. 7, in the range of the mode X, the acoustic mode in a direction parallel to the gate electrode, that is, a direction in which the gate electrode extends is excited. In the range of the mode Y which is narrower mode than the former, in addition to the mode X, the acoustic mode in a direction vertical to extension direction of the gate electrode is excited. Therefore, it is preferable that the semiconductor device be used as an oscillator in the range in which a plurality of modes is not excited, but only a single mode is excited among the oscillation conditions.

As shown in FIGS. 1A and 1B, it is preferable that the field effect transistor 100 include a plurality of gate electrodes 31 that is parallel to each other and is connected in parallel and the length $L_X$ of the element region 12 in the extension direction of the gate electrode 31 be constant. As described above, it is suggested that the oscillation peak of the acoustic standing wave depends on the length of the side of the element region 12. Therefore, it is preferable that the sides, which face each other and reflect the standing wave, among the sides of a polygon defining the shape of the element region 12 are vertical and parallel to the gate electrodes 31, in order to change the acoustic waves generated below each of the plurality of gate electrodes 31 into acoustic standing waves with the same frequency.

In addition, heat is generated by a resistive component of the channel under the conditions where a DC voltage is applied to the gate electrode and the drain region such that a large amount of drain current flows. When the temperature of the channel increases, the sound speed of the acoustic wave propagated through the semiconductor crystal is changed, which causes a variation in the oscillating frequency. Therefore, it is preferable that a low voltage be applied to the gate electrode in order to reduce the amount of heat and stabilize the oscillating frequency.

Since the semiconductor device according to this embodiment includes the field effect transistor, it is easy to integrate the semiconductor device into other electronic circuits. In addition, it is possible to provide a semiconductor device serving as an oscillator with high frequency accuracy, as compared to the oscillator integrated with the electronic circuit according to the related art.

For example, the temperature dependency of the oscillating frequency is less than that of a ring oscillator including an inverter. The reason is that the oscillating frequency of the transistor depends on the drain current in the ring oscillator and a variation in the amount of drain current according to the temperature is larger than a variation in the sound speed of the acoustic wave according to the temperature. In this embodiment, a variation in the amount of drain current does not directly affect the oscillating frequency.

The processing method dependency of the oscillating frequency is also less than that of the ring oscillator including the inverter. The drain current of the transistor depends on the accuracy of the gate length and the drain current affects the oscillating frequency in, for example, the ring oscillator. Therefore, the oscillating frequency depends on the processing accuracy of the gate length of the transistor.

In contrast, in the semiconductor device according to this embodiment, the oscillating frequency depends on the length of the side of the element region. For example, in the case of the mode X, the oscillating frequency depends on the width of the gate of the transistor. In general, the gate width of the transistor is designed to be 10 times to 100 times more than the gate length. Therefore, even though there is the same amount of processing variation in the gate width and the gate length, the ratio of the variation in the gate width is lower than the ratio of the variation in the gate length. Therefore, in the semiconductor device according to this embodiment, the processing method dependency of the oscillating frequency is less than that of the related art.

Figure 9:
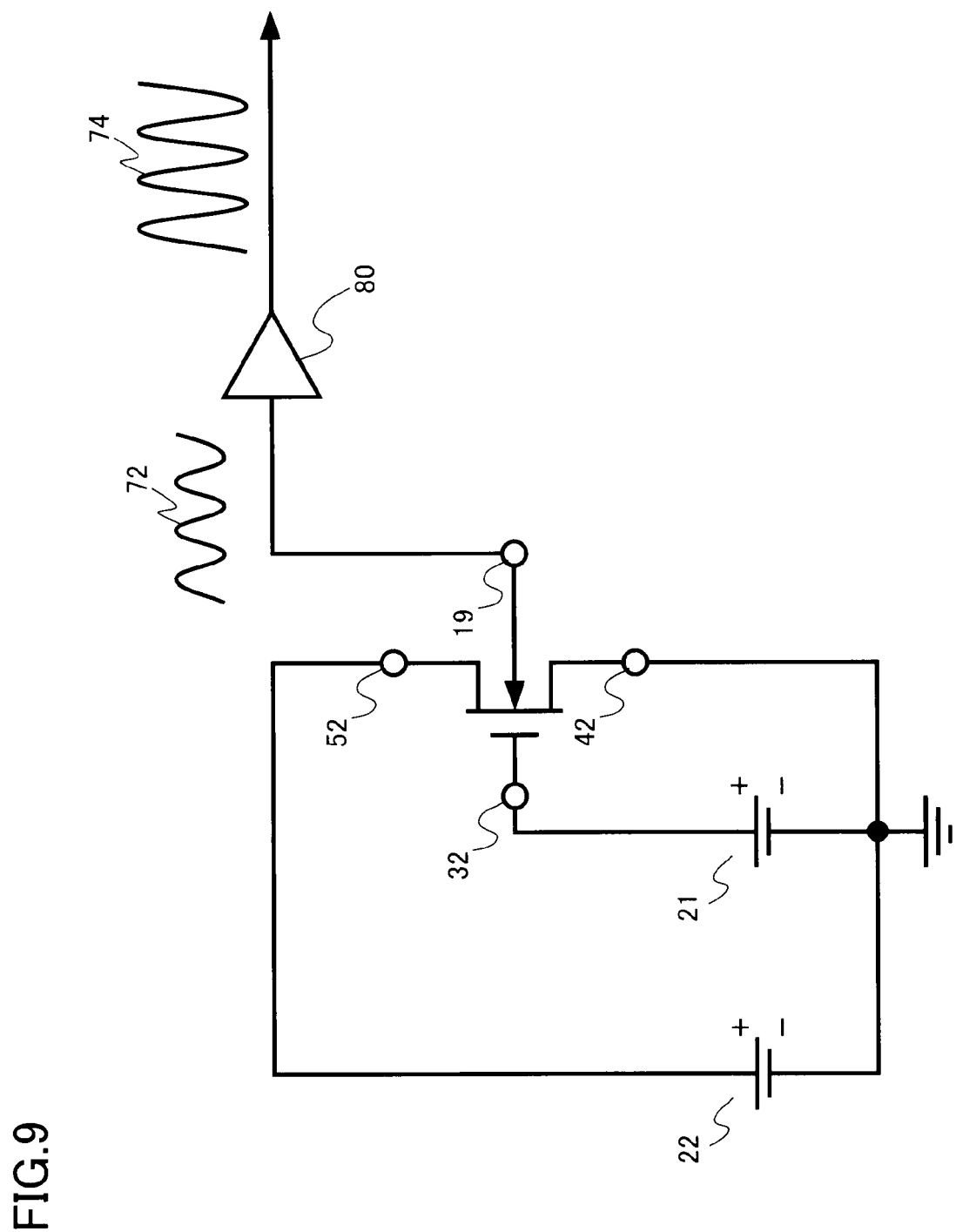
FIG. 9 is an equivalent circuit diagram of a modification of the semiconductor device according to the first embodiment.

FIG. 9 is an equivalent circuit diagram of a modification of the semiconductor device according to this embodiment. The modification includes an amplifier 80 connected to the output terminal 19 in addition to the structure of the semiconductor device shown in FIGS. 1A and 1B.

An electronic circuit, such as a single amplifying circuit, a push-pull amplifying circuit, or a differential amplifying circuit including a transistor, may be used as the amplifier 80, which is preferably implemented on the same semiconductor substrate.

According to this embodiment, even though an oscillating substrate current is very small, it is possible to amplify the amplitude of the electric signal 72 to obtain an electric signal 74.

Second Embodiment

A semiconductor device according to the second embodiment has the same structure as that according to the first embodiment except that dummy gate electrodes are provided between a plurality of gate electrodes. Therefore, a description of the same content as that in the first embodiment will be omitted.

Figures 10A, 10B:
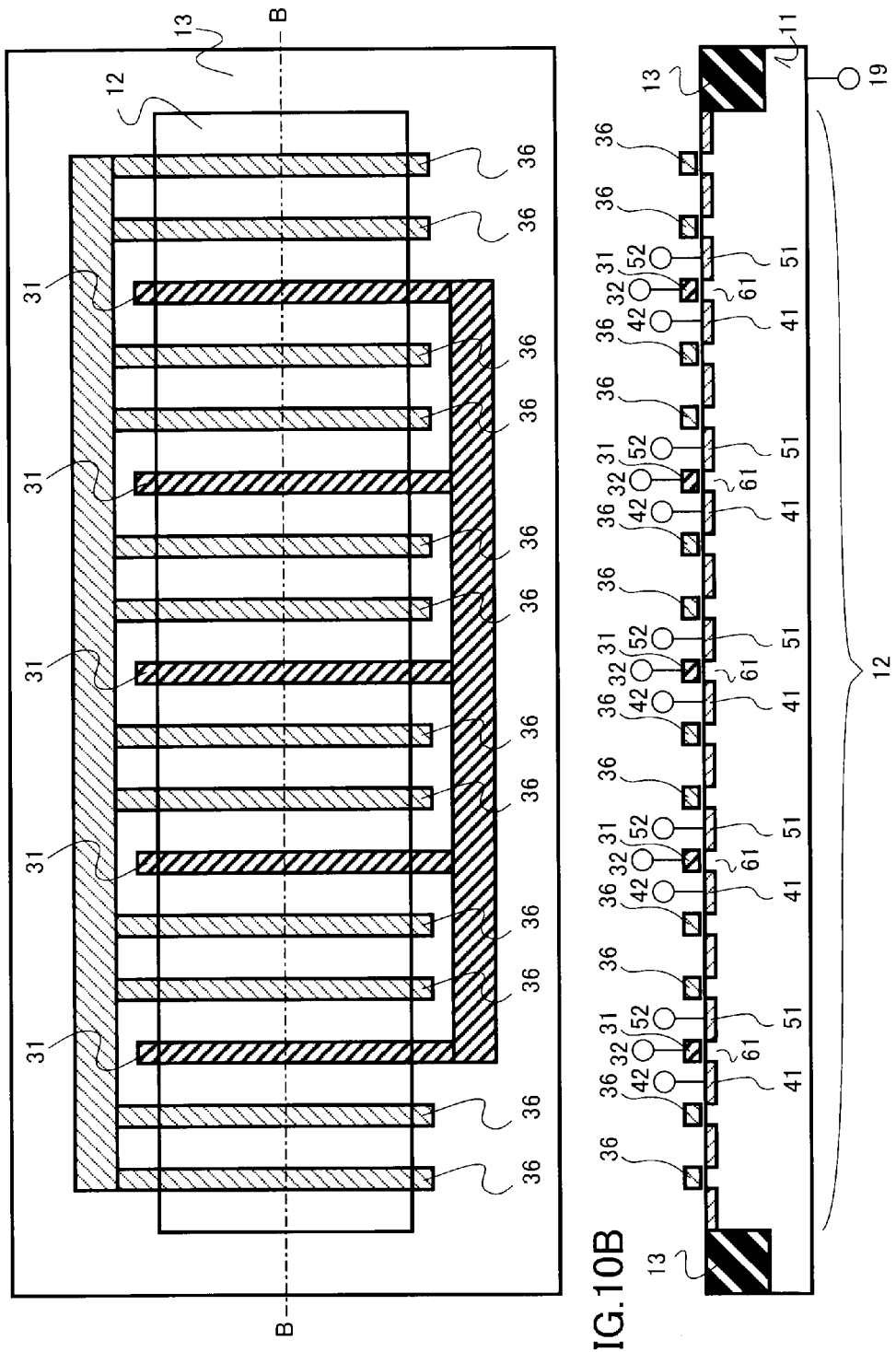
FIGS. 10A and 10B are diagrams schematically illustrating the structure of a semiconductor device according to the second embodiment.

FIGS. 10A and 10B are diagrams schematically illustrating the structure of the semiconductor device according to this embodiment. FIG. 10A is a plan view and FIG. 10B is a cross-sectional view taken along the line B-B of FIG. 10A.

In this embodiment, a plurality of dummy gate electrodes 36 is provided between the gate electrode 31 and the gate electrode 31 and these dummy gate electrodes 36 are not connected to a DC voltage source, but are connected to the ground potential. In this way, it is possible to disperse heat sources generated by a resistive component of the channel region 61 and prevent an increase in the temperature of the field effect transistor.

When the temperature of the channel region 61 increases, the sound speed of the acoustic wave propagated through the semiconductor crystal is changed, which causes a variation in the oscillating frequency. Therefore, according to the structure of this embodiment, it is possible to achieve a semiconductor device capable of forming an oscillator with a stable oscillating frequency by preventing an increase in the temperature due to heat.

Third Embodiment

A semiconductor device according to the third embodiment has the same structure as that according to the second embodiment except that the number of dummy gate electrodes arranged between the gate electrodes is not constant and the element region has a different shape. Therefore, a description of the same content as that in the second embodiment will be omitted.

FIGS. 11A and 11B are diagrams schematically illustrating the structure of the semiconductor device according to this embodiment. FIG. 11A is a plan view and FIG. 11B is a cross-sectional view taken along the line C-C of FIG. 11A.

This embodiment is the same as the second embodiment in that a plurality of dummy gate electrodes 36 is provided between the gate electrode 31 and the gate electrode 31, but is different from the second embodiment in that the number of dummy gate electrodes 36 between the gate electrodes 31 is not constant, but different numbers of dummy gate electrodes 36 are provided between the gate electrodes 31. The shape of the element region 12 is not a rectangle, but the side of the element region that does not intersect the gate electrode 31 is deformed stepwise such that the length of the element region 12 in a direction vertical to the extension direction of the gate electrode 31 is not constant. In this way, it is possible to prevent the excitation of the acoustic standing wave in a direction vertical to the gate electrode 31.

When the excitation of the acoustic standing wave in a direction vertical to the gate electrode 31 is prevented, it is possible to provide a semiconductor device suitable for forming an oscillator that excites only the single-mode acoustic standing wave.

Fourth Embodiment

A semiconductor device according to the forth embodiment has the same structure as that according to the first embodiment except that it further includes a temperature detecting element which detects the temperature of the channel region and a temperature compensation circuit which controls the gate voltage $V_{gs}$ and the drain voltage $V_{ds}$ on the basis of the detection result of the temperature detecting element. Therefore, a description of the same content as that in the first embodiment will be omitted.

Figure 12:
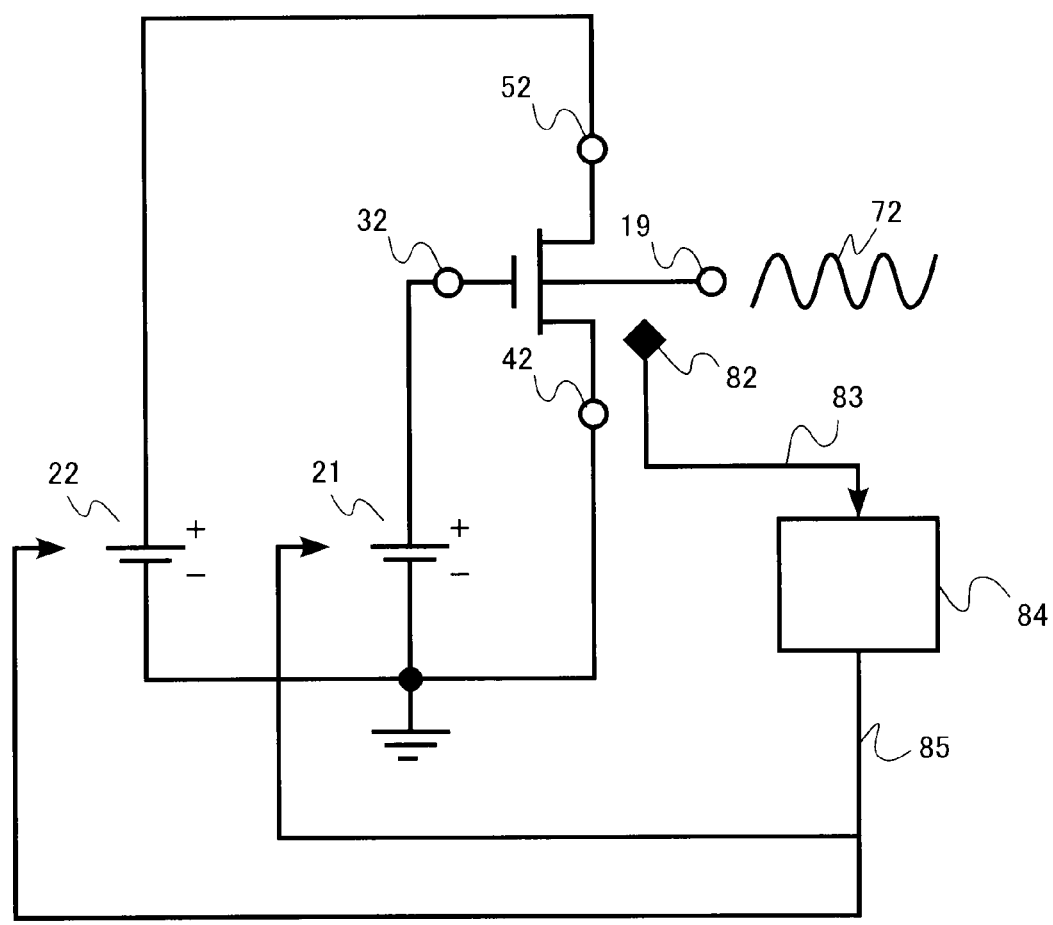
FIG. 12 is an equivalent circuit diagram of a semiconductor device according to the fourth embodiment.

FIG. 12 is an equivalent circuit diagram of the semiconductor device according to this embodiment. The semiconductor device includes a temperature compensation circuit 84 that receives a temperature detection signal 83 from a temperature detecting element 82 for detecting the temperature of the field effect transistor and outputs a temperature compensation signal 85 for controlling the gate voltage $V_{gs}$ and the drain voltage $V_{ds}$.

The DC voltage sources 21 and 22 connected to the gate terminal 32 and the drain terminal 52 are controlled to increase or decrease the amount of current flowing through the channel region 61 of the field effect transistor, thereby controlling the amount of heat from the channel region 61 of the transistor using the self-heating effect of the field effect transistor. In this way, it is possible to maintain the temperature of the channel region 61 to be constant. Therefore, it is possible to provide a semiconductor device capable of preventing a variation in the propagation speed of the acoustic wave propagated through the element region 12 in which the acoustic standing wave is excited due to a change in the channel temperature and obtaining a stable oscillating frequency.

As the temperature detecting element 82, for example, the following elements may be used: an element using the temperature dependency of a voltage drop in the PN junction; and an element using thermal electromotive force. In addition, as the field effect transistor for increasing the temperature using the self-heating effect, any of the following transistors may be used: a transistor that actually excites the acoustic standing wave; and a field effect transistor that is formed by a dummy gate electrode provided in the vicinity thereof.

Fifth Embodiment

A semiconductor device according to the fifth embodiment has the function of a frequency filter.

Figure 13A:
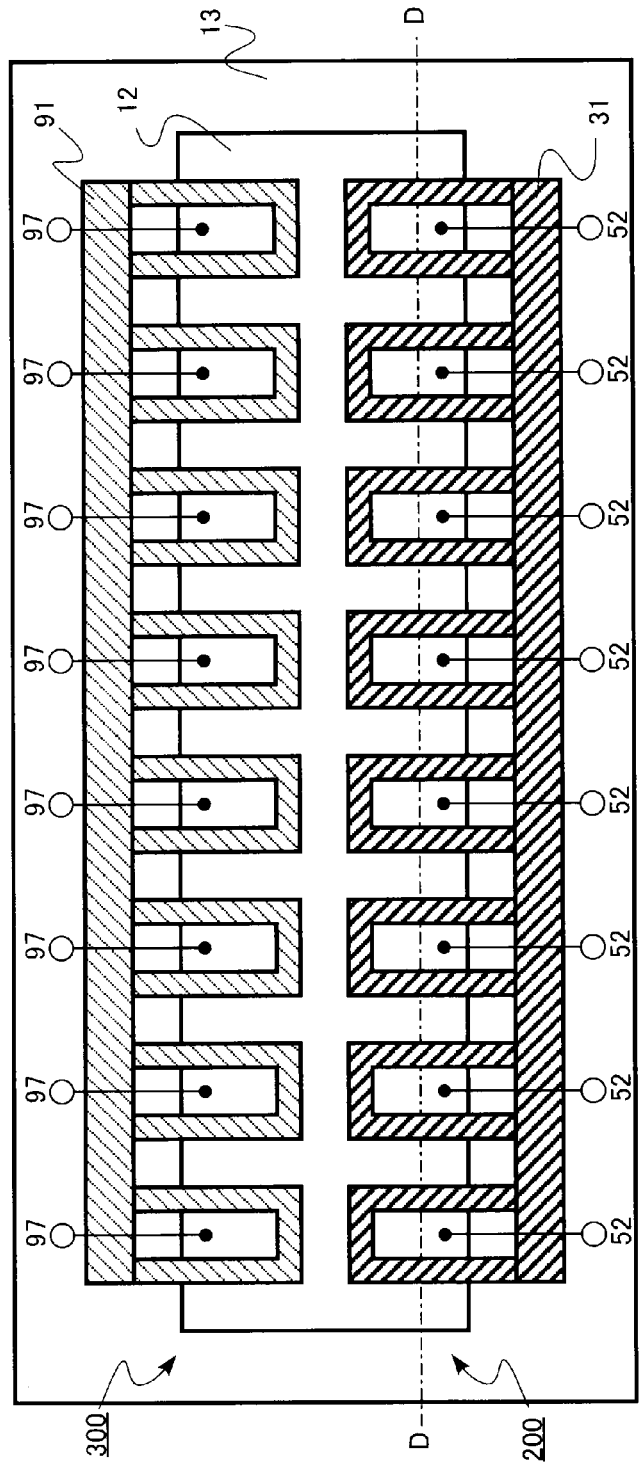
FIGS. 13A and 13B are diagrams schematically illustrating the structure of a semiconductor device according to the fifth embodiment.
Figure 13B:
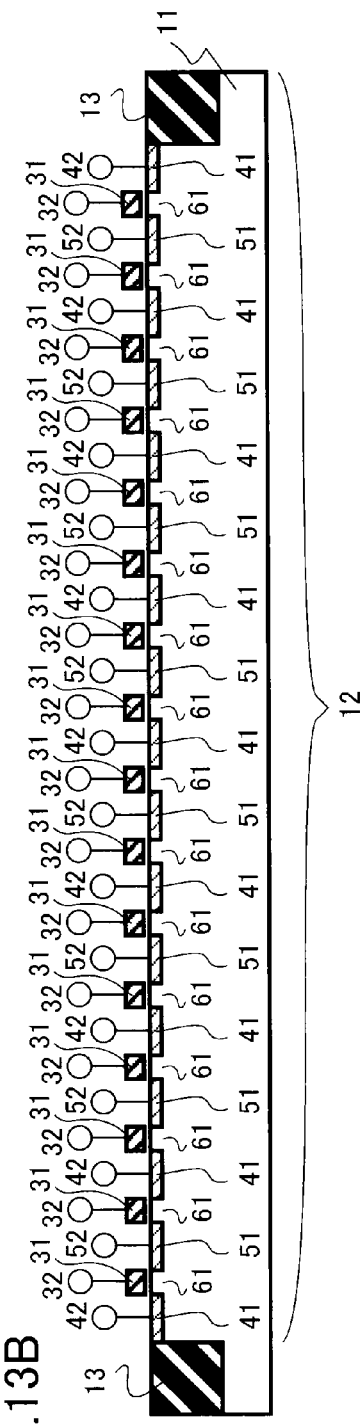

FIGS. 13A and 13B are diagrams schematically illustrating the structure of the semiconductor device according to this embodiment. FIG. 13A is a plan view and FIG. 13B is a cross-sectional view taken along the line D-D of FIG. 13A.

In the semiconductor device according to this embodiment, two field effect transistors, that is, a first field effect transistor 200 and a second field effect transistor 300 are provided in the element region 12 surrounded by the element isolation region 13, which is an acoustic reflection layer.

Each of the gate electrodes 31 and 91 of the first and second field effect transistors includes a plurality of loops that is electrically connected in parallel to each other. A first drain terminal 52 and a second drain terminal 97 are electrically connected to a diffusion layer region inside each of the loops. A common source terminal 42 is connected to the diffusion layer region outside each of the loops.

A DC voltage is applied to the gate electrode and the drain electrode such that the acoustic standing wave is not automatically excited in each of the field effect transistors, and a high frequency signal is superimposed on the DC voltage applied to the first gate electrode 31. In this way, the acoustic standing wave is excited in the element region 12 by the frequency of an input signal that is equal to the resonance frequency determined by the size of the element region 12.

The acoustic wave is propagated through the second field effect transistor 300 and an impact ionization phenomenon occurs with a period synchronized with the resonance frequency in the second field effect transistor 300. Thereby, only a specific frequency component is detected from the drain terminal 97 of the second field effect transistor 300. Therefore, the semiconductor device according to this embodiment functions as a frequency filter.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

For example, the present invention can be applied to both an n-type MOS transistor (n-type MIS transistor) using an electron as a carrier and a p-type MOS transistor (p-type MIS transistor) using a hole as a carrier.

In the semiconductor devices according to the above-described embodiments, the element region and the field effect transistor in the element region are formed on the semiconductor substrate. However, the element region and the field effect transistor in the element region may be formed in a well, which has a conductive type different from that of the semiconductor substrate, in the semiconductor substrate. In this case, it is possible to detect an electric signal synchronized with the acoustic standing wave from an output terminal that is connected to the well having the channel region provided therein.

What is claimed is:

1. A semiconductor device comprising:
   a semiconductor substrate;
   an element region formed in the semiconductor substrate;
   an element isolation region surrounding the element region;
   a field effect transistor including a gate electrode formed on or above the element region, source and drain regions formed at both sides of the gate electrode in the element region, and a channel region formed in the element region being interposed between the source region and the drain region;
   gate, source, and drain terminals configured to apply a voltage to the gate electrode, the source region, and the drain region, respectively; and
   an output terminal being electrically connected to the channel region and configured to output an oscillating signal, the output terminal being not common with the gate, source, and drain terminals,
   wherein, the threshold voltage of the field effect transistor $V_{th}$, a gate voltage $V_{gs}$ applied between the source terminal and the gate terminal and a drain voltage $V_{ds}$ applied between the source terminal and the drain terminal satisfy the following relationship:

$$V_{th} < V_{gs} < V_{ds} V_{th}.$$

2. The device according to claim 1, further comprising:
   an amplifier being connected to the output terminal.

3. The device according to claim 1,
   wherein the field effect transistor includes a plurality of gate electrodes being physically parallel to each other and being connected electrically in parallel, and
   the length of the element region in the extension direction of the gate electrode is constant.

4. The device according to claim 1,
   wherein the field effect transistor includes a plurality of gate electrodes being physically parallel to each other and being connected electrically in parallel, and
   dummy gate electrodes being provided between the plurality of gate electrodes.

5. The device according to claim 1,
   wherein the length of the element region in a direction vertical to the extension direction of the gate electrode is not constant.

6. The device according to claim 1, further comprising:
   a temperature detecting element configured to detect the temperature of the channel region; and
   a temperature compensation circuit configured to control the gate voltage Vgs and the drain voltage Vds on the basis of the detection result of the temperature detecting element.

\* \* \* \* \*